United States Patent
Le Perchec et al.

(10) Patent No.: US 11,652,119 B2
(45) Date of Patent: May 16, 2023

(54) DETECTION COMPONENT INCLUDING BLACK PIXELS AND METHOD FOR MANUFACTURING SUCH A COMPONENT

(71) Applicant: COMMISSARIAT A L'ENERGIE ATOMIQUE ET AUX ENERGIES ALTERNATIVES, Paris (FR)

(72) Inventors: Jérôme Le Perchec, Grenoble (FR); Giacomo Badano, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 129 days.

(21) Appl. No.: 17/131,994

(22) Filed: Dec. 23, 2020

(65) Prior Publication Data
US 2021/0199863 A1    Jul. 1, 2021

(30) Foreign Application Priority Data
Dec. 30, 2019 (FR) ...................... 19 15735

(51) Int. Cl.
*H01L 27/146* (2006.01)
*G01J 5/58* (2022.01)
*G01J 5/0802* (2022.01)
*H01L 31/0216* (2014.01)
*G02B 5/22* (2006.01)

(52) U.S. Cl.
CPC ...... *H01L 27/14623* (2013.01); *G01J 5/0802* (2022.01); *G01J 5/58* (2013.01); *G02B 5/22* (2013.01); *H01L 31/02164* (2013.01)

(58) Field of Classification Search
CPC .......... H01L 27/14623; H01L 31/02164; G01J 5/0802; G01J 5/58
See application file for complete search history.

(56) References Cited

U.S. PATENT DOCUMENTS

| | | | |
|---|---|---|---|
| 9,281,338 B2 * | 3/2016 | Chen | ................. H01L 27/14698 |
| 9,417,134 B2 * | 8/2016 | Koechlin | .......... H01L 27/14685 |
| 9,698,192 B1 | 7/2017 | Crook et al. | |

(Continued)

FOREIGN PATENT DOCUMENTS

WO    WO 2019/004319 A1    1/2019

OTHER PUBLICATIONS

French Preliminary Search Report dated Sep. 17, 2020 in French Application 19 15735 filed on Dec. 30, 2019 (with English Translation of Categories of Cited Documents), 2 pages.

(Continued)

*Primary Examiner* — David P Porta
*Assistant Examiner* — Jeremy S Valentiner
(74) *Attorney, Agent, or Firm* — Oblon, McClelland, Maier & Neustadt, L.L.P.

(57) ABSTRACT

A detection component is provided for detecting electromagnetic radiation, the detection component comprising a mask arranged to block the electromagnetic radiation for at least one detector. The opaque mask comprises a successive stack of a first metal layer, a second metal layer, a third transparent layer having a low optical index, and an assembly of metal components. The second metal layer, the transparent layer, and the assembly of components form MIM structures in the wavelength range. The invention further relates to a method for manufacturing such a detection component.

19 Claims, 5 Drawing Sheets

(56) References Cited

U.S. PATENT DOCUMENTS 9,929,196 B2 * 3/2018 Vilain .............. H01L 27/14629
10,326,952 B2    6/2019 Ran et al.

OTHER PUBLICATIONS

Wang et al., "Plasmonic Infrared Bandstop Reflective Filter", IEEE Journal of Selected Topics in Quantum Electronics, vol. 19, No. 3, 2013, 5 pages.
Palanchoke et al., "CMOS-Compatible Metallic Nanostructures for Visible and Infrared Filtering", Proceedings of SPIE, vol. 8994, IEEE, 2014, pp. 89940Y-1-89940Y-6.
Hibbins et al., "Resonant absorption or electromagnetic fields by surfaces plasmons buried in a multilayered plasmonic nanostructure", Physical Review B, 74, 073408, 2006, 5 pages.
U.S. Appl. No. 16/801,669, filed Feb. 26, 2020, 2020/0274018 A1, Le Perchec, J.
U.S. Appl. No. 16/477,359, filed Jul. 11, 2019, 2019/0383969 A1, Badano, G, et al.
U.S. Appl. No. 16/693,432, filed Nov. 25, 2019, 2020/0176494 A1, Badano, G, et al.
U.S. Pat. No. 9,853,173 B2, Dec. 26, 2017, 2016/0225923 A1, Badano, G, et al.
U.S. Pat. No. 9,705,015 B2, Jul. 11, 2017, 2017/0069768 A1, Badano, G, et al.
U.S. Pat. No. 10,141,470 B2, Nov. 27, 2018, 2017/0244001 A1, Boulard,F, et al.

* cited by examiner

Fig. 1
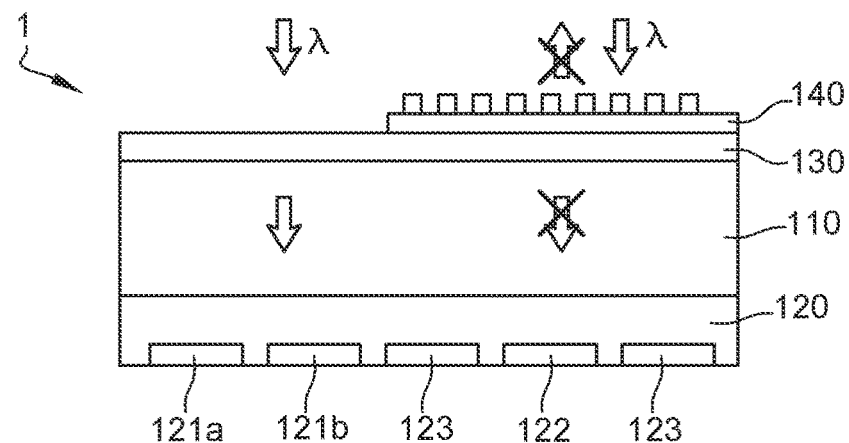
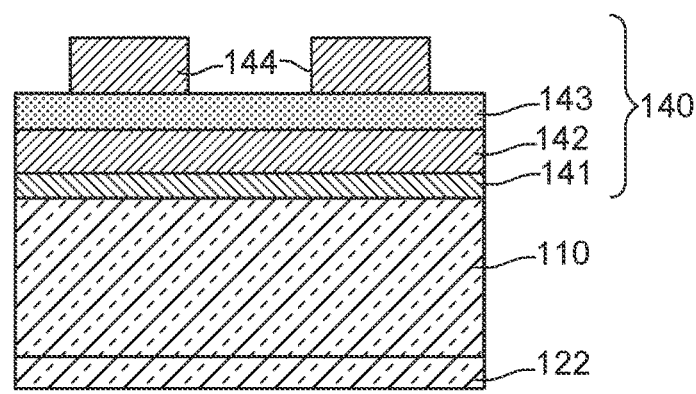
Fig. 2A
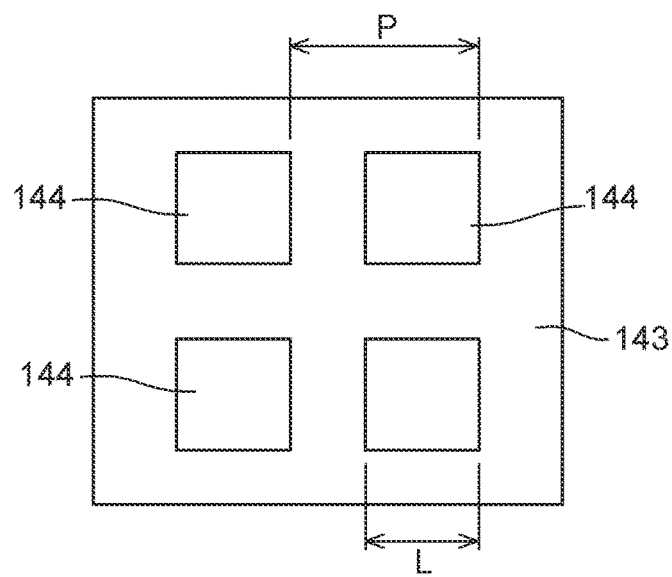
Fig. 2B

DETECTION COMPONENT INCLUDING BLACK PIXELS AND METHOD FOR MANUFACTURING SUCH A COMPONENT

TECHNICAL FIELD

The invention relates to the field of components for detecting electromagnetic radiation and particularly components for detecting electromagnetic radiation in the infrared wavelength ranges.

Thus, the invention refers to a component for detecting electromagnetic radiation and a method for manufacturing such a component.

PRIOR ART

In the context of applications for detecting weak electromagnetic signals, such as for components for detecting infrared radiation in space, in order to better identify an effective photon signal versus noise, it is known, in particular from document U.S. Ser. No. 10/326,952, that an opaque mask can be placed over certain detection pixels of these components in order to measure a dark current from said covered pixels.

Thus, with such a configuration described by the document U.S. Ser. No. 10/326,952 for determining the dark current and therefore the noise signal, it is possible to identify the relevant signal emanating from this noise.

However, without further information on the configuration of the mask in the document U.S. Ser. No. 10/326,952, other than that it is possible to provide a mask of a reduced thickness of 1 μm with an adequate material (chromium is mentioned), a mask as described in that document is generally made of metal and is relatively thick, i.e. equal to or greater than 1 μm.

Thus, in the case of a detection component according to a given configuration in which the component comprises a support comprising an active layer in which a plurality of electromagnetic radiation detection structures are made, with the support comprising a first surface from which the active layer extends and a second surface, opposite the first surface, by which the support is intended to receive the electromagnetic radiation, and a mask arranged on the second surface, the following phenomena are observed:
    shading due to the relatively large thickness of the masks,
    diffraction associated with the edges of the mask and causing photon leakage toward the masked structures,
    parasitic reflection in the enclosure containing the component, which may result in spurious signals.

In addition, it should be noted that in the case of low-temperature infrared-radiation detection components, due to the thermal conditions to which they are subjected, they may involve substantial risks of deterioration and delamination for relatively thick opaque masks. In such a use, the use of relatively thin opaque masks should make it possible to limit the risks of deterioration and delamination.

DISCLOSURE OF THE INVENTION

The purpose of the invention is to overcome the above drawbacks, at least in part, and thus aims to provide a detection component which, having the configuration in question, is only partially or even not at all subject to the parasitic reflection phenomena present in the prior art. The invention also aims to provide a detection component capable of having an opaque mask that is less sensitive to deterioration and delamination risks when the component is subjected to low temperatures, particularly in the case of detection components intended to operate at said low temperatures.

To that end, the invention relates to a component for detecting electromagnetic radiation in a wavelength range, comprising:
    a support comprising an active layer, in which a plurality of structures for detecting electromagnetic radiation in said wavelength range is arranged, said support comprising a first surface from which the active layer extends, and a second surface opposite the first surface by which the support is intended to receive the electromagnetic radiation,
    at least one opaque mask, arranged on a portion of the second surface of the support to block the electromagnetic radiation for at least one of the detection structures, called a masked structure.

The opaque mask comprises at least a first, a second, and a third metal, and a transparent material with a refractive index less than or equal to 2 within the wavelength range, the first metal having an extinction coefficient $k_{m1}$ greater than or equal to $5n_{m1}$, or even $10n_{m1}$, and each of the the second and third metals having an extinction coefficient $k_{m2/3}$ strictly less than $5n_{m2/3}$, or even less than or equal to $2n_{m2/3}$ with $n_{m1}$ and $n_{m2/3}$ being the refractive indices of the first and second and third metals in the wavelength range, with the transparent material having an extinction coefficient $k_t$ less than or equal to 0.01.

Starting from the second surface of the support, the opaque mask comprises a successive stack of:
    a first metal layer made of the first metal,
    a second metal layer made of the second metal,
    a third layer, called a transparent layer, made of the transparent material, and
    an assembly of metal elements made of the third metal, said assembly being arranged on the transparent layer opposite the second metal layer,
    and wherein the second metal layer, the transparent layer, and the assembly of metal elements form MIM structures in the wavelength range.

Thus, according to the invention the extinction coefficients $k_{m2}$ and $k_{m3}$ of the second and third metals may satisfy at least one of the following inequalities with regard to the refractive indices $n_{m2}$ and $n_{m3}$ of the second and third metals, respectively:

$$k_{m2/3} < 5n_{m2/3},$$

$$k_{m2/3} \le 4n_{m2/3}, k_{m2/3} \le 2n_{m2/3}.$$

Such a combination of MIM structures based on "absorbent" metals, that is, metals having an extinction coefficient $k_{m2}$ strictly less than $5n_{m2}$, and a reflective layer based on a "reflective" metal, that is, a metal having an extinction coefficient $k_{m1}$ greater than or equal to $5n_{m1}$, makes it possible to take advantage of both the blocking properties provided by the first metal and the first layer made of that metal, and the anti-reflection properties afforded by the MIM structure in the wavelength range. Thus, it is possible to provide a thin mask limiting the shading phenomenon that such a mask could cause, with little or no reflection, thus limiting the risks of parasitic reflection in the nearby environment of the detection component and thus the corresponding spurious signals.

In addition, since such an opaque mask can constitute a relatively thin opaque mask compared to the opaque masks of the prior art, such as the one disclosed in the document U.S. Ser. No. 10/326,952, the opaque mask of a component according to the invention entails relatively low risks of deterioration and delamination when the component is subjected to low temperatures.

Note that a metal is characterized by an electric permittivity $\varepsilon=(n+ik)^2$, where n is the refractive index of said metal and k is the extinction coefficient. Based on this value, it is possible to calculate a skin depth $\delta$ at a given wavelength $\lambda$ using the following equation: $\delta=\lambda/(2\pi k)$.

The MIM (Metal-Insulator-Metal) structures are horizontal multilayer cavities used in particular for antennas. An MIM structure comprises a first metal layer covered with a transparent layer, generally dielectric, and a metal element, such as a metal bump, preferably made of the same metal as said first metal layer. In the conventional application of such MIM structures, in which cavity resonances that are relatively selective in terms of wavelength are used, the metal of the first metal layer and the assembly of metal elements is a metal having good reflectivity, i.e. a metal for which the extinction coefficient in the wavelength in question is greater than 10 times the refractive index of this same metal at the wavelength in question. More information on such MIM structures can be found in the article published in 2006 by A. P. Hibbins and his co-authors, in the scientific journal "Physical Review B," Number 74, Pages 073408.

The second and third metals may be identical.

With such a configuration, the absorption rate of the MIM structure is optimized.

The first metal layer may have a thickness $h_{m1}$ more than 2 times greater than a skin depth $\delta_{m1}$ of the first metal in the wavelength range, with the thickness of the first metal layer preferably being more than 4 times greater than the skin depth $\delta_{m1}$ of the first metal in the wavelength range.

In this way the opaque mask has a particularly low or even substantially zero transmission rate.

The second metal layer may have a thickness $h_{m2}$ of between 0.5 times a skin depth $\delta_{m2}$ of the second metal in the wavelength range and 4 times the skin depth $\delta_{m2}$ of the second metal in the wavelength range, with the thickness of the first metal layer preferably being more than 4 times greater than the skin depth $\delta_{m1}$ of the first metal in the wavelength range.

Within a plane substantially parallel to the second surface, the metal elements may have at least one lateral dimension L equal to or less than a value Lm satisfying the following equation:

$$Lm = \frac{\lambda_0}{2n_d\sqrt{\left(1+\frac{2\delta_{m2}}{h_d}\right)}}$$

where $\lambda_0$ is a central wavelength within the wavelength range, $n_d$ is a refractive index of the transparent material at said central wavelength, $h_d$ is a thickness of the transparent layer, and $\delta_{m2}$ is a skin depth of the second metal at said wavelength, the metal elements preferably have a maximum lateral dimension and a minimal lateral dimension within a plane substantially parallel to the second surface, of between 0.75 times said value Lm and 1.25 times the value Lm.

The MIM structures are thus particularly well-suited to the wavelength range.

In the assembly of metal elements, two adjacent metal elements have an inter-barycentric distance between them that is less than or equal to $\lambda_0/n_d$, with $\lambda_0$ being a central wavelength of the wavelength range and $n_d$ being the refractive index of the transparent material in the wavelength range, with the pitch P between two adjacent metal elements in the assembly of metal elements preferably being less than 0.75 times $\lambda_0/n_d$.

The metal elements of the assembly of metal elements may be arranged periodically with a pitch P between the metal elements of less than $\lambda_0/n_d$, said pitch P between the metal elements preferably being less than 0.75 times $\lambda_0/n_d$.

The transparent layer may have a thickness of between $\lambda_0/4n_d$ and $\lambda_0/50n_d$, inclusively, with $\lambda_0$ being a central wavelength within the wavelength range and $n_d$ being the refractive index of the transparent material in the wavelength range.

The thickness of the transparent layer may be between $\lambda_0/4n_d$ and $\lambda_0/25n_d$, inclusively.

Each metal element of the assembly of metal elements may have a thickness in the stacking direction of the opaque mask that is between one times a skin depth $\delta_{m2}$ of the third metal in the wavelength range and three times said skin depth $\delta_{m2}$ of the second metal, with the thickness of each metal element preferably being between one and a half times the skin depth $\delta_{m2}$ of the third metal in the wavelength range and two and a half times said skin depth $\delta_{m2}$ of the third metal.

With such parameters of the MIM structures, the reflection rate of the opaque mask is particularly low or even substantially zero.

The opaque mask may be arranged on the second surface of the support to block the electromagnetic radiation for the at least one masked structure and the detection structures adjacent to said at least one masked structure.

With such an arrangement, the potential collection of photo-carriers from the adjacent structures to the masked structure, which could occur as a result of the typical electrical cross-talk between adjacent pixels, is limited.

The opaque mask may be arranged on the second surface of the support to also block the electromagnetic radiation for the detection structures adjacent to said detection structures adjacent to said at least one masked structure.

With such an arrangement, the potential risk of collecting photo-carriers from the adjacent structures is substantially zero.

The support may have a thickness of less than 10 µm, with the opaque mask extending, on either side of a projection of the masked structure, on the second surface of the support over a distance greater than 15 µm and preferably greater than 30 µm.

The detection structures of the plurality of detection structures may be arranged according to a matrix defining detection structure rows and columns, the opaque mask is arranged to block the electromagnetic radiation for des detection structures of the same row or column.

The invention furthermore relates to a method for manufacturing a component for detecting electromagnetic radiation in a wavelength range, said method comprising the following steps:

providing a support comprising a layer, called active layer, in which a plurality of structures for detecting electromagnetic radiation in said wavelength range is arranged, the support comprising a first surface from which the active layer extends, and a second surface opposite the first surface by which the support is intended to receive the electromagnetic radiation, forming an opaque mask comprising, starting from the second surface of the support, a successive stack of:
a first metal layer made of a first metal,
a second metal layer made of a second metal, a third layer, called a transparent layer, made of a material, called a transparent material, with a refractive index less than or equal to 2 in the wavelength range, and an assembly of metal elements made of a third metal, said assembly being arranged on the transparent layer opposite the second metal layer, with the second metal layer, the transparent layer, and the assembly of metal elements forming MIM structures in the wavelength range, the opaque mask being arranged on a portion of the second surface of the support to block the electromagnetic radiation for at least one of the detection structures, called a masked structure, in which method the opaque mask comprises the first, the second, and the third metal and the material, called a transparent material, with the first metal having an extinction coefficient $k_{m1}$ greater than or equal to $5n_{m1}$, or even $10n_{m1}$, and each of the second and third metals having an extinction coefficient $k_{m2/3}$ strictly less than $5n_{m2/3}$, or even less than or equal to $2n_{m2/3}$ with $n_{m1}$ and $n_{m2/3}$ being the refractive indices of the first and each of said second and third metals in the wavelength range, the transparent material having an extinction coefficient $k_t$ less than or equal to 0.01.

Such a method makes it possible to manufacture a detection component according to the invention and to obtain the associated advantages.

The formation step consists of the following sub-steps:
deposition of the first metal layer made of the first metal in contact with the second surface of the support,
deposition of the second metal layer made of the second metal in contact with the first metal layer,
deposition of the transparent layer made of the transparent material in contact with the second metal layer, with the third layer being called a transparent layer,
formation of an assembly of metal elements made of the third metal on the transparent layer opposite the second metal layer.

During the opaque mask formation step, the mask is arranged on the second surface of the support to block the electromagnetic radiation for the at least one masked structure and the detection structures adjacent to said at least one masked structure.

In this way, a component manufactured with such a method provides, in operation, a masked structure that has little or even no exposure to leakage currents that could be generated by the adjacent structures if they are subjected to electromagnetic radiation.

BRIEF DESCRIPTION OF THE FIGURES

The present invention will be more readily understood from a reading of the description of embodiments, given purely as examples and not intended to limit in anyway, in reference to the appended drawings, in which:

FIG. 1 shows a lateral cross-sectional view of the detection component according to the invention, FIGS. 2A and 2B show a close-up lateral cross-section of a detection component showing the arrangement of a masking element on a detection component according to the invention, and a top view of this same masking element, respectively.

Figure 3A:
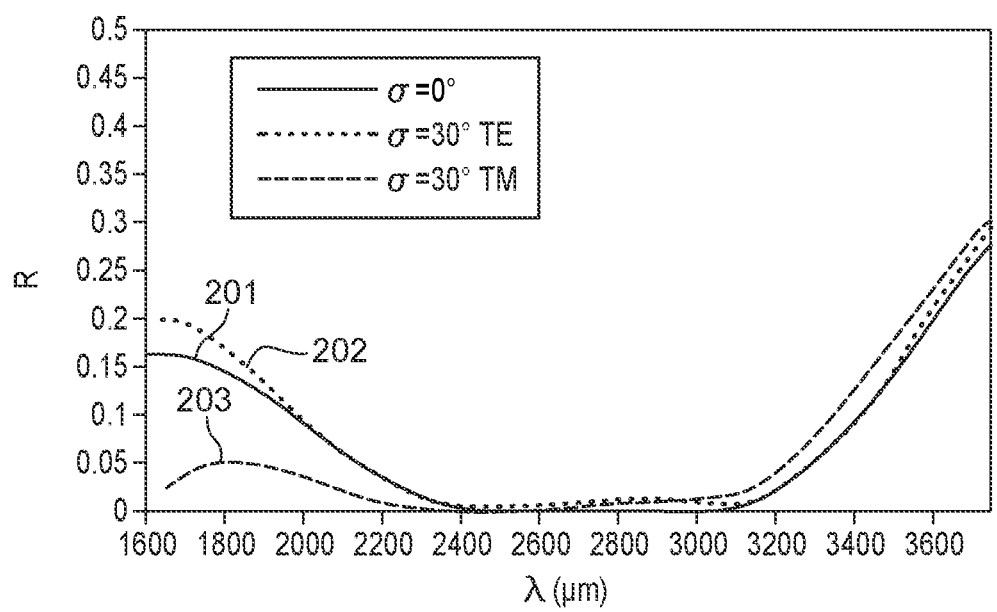
FIGS. 3A and 3B are graphic illustrations of the variation in the reflectivity of a masking element according to the invention as a function of the wavelength for various angles of incidence of the electromagnetic radiation, and the variation in the reflectivity of a masking element according to a variant of the invention as a function of the wavelength, respectively.

Identical, similar, or equivalent parts of the various figures have the same numerical references so as to facilitate the reading of the various figures.

In an effort to make the figures more legible, the various parts in the figures are not necessarily shown according to a uniform scale.

The various possibilities (variants and embodiments) must be understood as not being exclusive of each other, and may therefore be combined.

DESCRIPTION OF THE EMBODIMENTS

FIG. 1 shows a detection component of the invention equipped with a mask 140, called a blocking mask, arranged on a portion of the second surface of a support 110 of detection component 1 to totally block the electromagnetic radiation for at least one of detection structures of said detection component 1.

Such a detection component 1, according to a main embodiment of the invention, is more specifically intended for the detection of electromagnetic radiation in the infrared wavelength range. Thus, the various values indicated in the embodiments described below refer to this practical application, in which the targeted wavelength range is in a mid-infrared wavelength range, for example a wavelength range of between 2.5 and 3.5 μm. Naturally, based on the disclosure herein, a person skilled in the art is perfectly capable of adapting these values in order to achieve an optimized detection of electromagnetic radiation in a wavelength range other than the infrared, by using such a detection structure 10. Thus, the invention is particularly advantageous in the context of applications for detecting electromagnetic radiation in the infrared wavelength ranges based on the detection components operating at low temperatures, that is, typically less than −100° C. or 173 K, most commonly around 80 K as in the case of HgCdTe-based detectors.

Such a detection component 1 includes:
the support 110 comprising a layer, called active layer 120, in which a plurality of detection structures 121a, 121b, 122, and 123 for detecting electromagnetic radiation λ in said wavelength range is arranged, with the support 110 comprising a first surface from which the active layer 120 extends, and a second surface opposite the first surface by which the support 110 is intended to receive the electromagnetic radiation λ, the opaque mask 140 arranged on a portion of the second surface of the support 110 to block the electromagnetic radiation of a detection structure 122, which is masked.

As shown in FIGS. 2A and 2B as part of a variant of this embodiment, in which the opaque mask is arranged on a portion of the second surface of the support 110 not provided with anti-reflective coating 130, the opaque mask 140 comprises, starting from the second surface of the support 110, a successive stack of:

a first metal layer 141 made of a first metal,
a second metal layer 142 made of a second metal,
a third layer 143, called a transparent layer, made of a transparent material, and
an assembly of metal elements 144 made of the second metal, said assembly being arranged on the transparent layer 143 opposite the second metal layer 142.

The second metal layer 142, the transparent layer 143, and assembly of metal elements 144 form MIM structures in the wavelength range.

The first metal has an extinction coefficient $k_{m1}$ greater than or equal to $5n_{m1}$ and the second metal has an extinction coefficient $k_{m2}$ strictly less than $5n_{m2}$, or even less than or equal to $2n_{m2}$, with $n_{m1}$ and $n_{m2}$ being refractive indices of the first and of the second metal in the wavelength range. Preferably, the first metal has an extinction coefficient $k_{m1}$ greater than or equal to $10n_{m1}$.

Note that according to one possibility of the invention, the second metal may have an extinction coefficient $k_{m2}$ that is less than or equal to $4n_{m2}$.

In this first embodiment, the first support 110 is a cadmium telluride and zinc CdZnTe, the first support 110 comprising the active layer 120 made of a mercury cadmium telluride, HgCdTe. Each detection structure 121A, 121B, 122, and 123 consists, for example, of a PN photodiode comparable to those implemented in the prior art, which are only shown by their respective volume footprints on the active layer.

Naturally, while each detection structure 121A, 121B, 122, and 123 is a PN photodiode in this first embodiment, the invention is not limited to this sole type of detection structure. Thus, the component may, for example, comprise another type of photodiode, such as a PiN photodiode (i.e. a photodiode having an intrinsic area made between an N area and a P area), a zener diode, or a barrier diode, without the scope of the invention being exceeded.

The support 110 may have a thickness between 1 and 20 μm, preferably between 5 and 15 μm. Thus, the support can therefore have a thickness of 10 μm, for example.

The second surface of the support 110 may comprise an anti-reflective coating 130 according to the customary practice of a person skilled in the art, in the context of the detection components 1 from the prior art. Note that in the present embodiment, as shown in FIG. 1, the opaque mask 140 is placed on the surface of this anti-reflective coating 130. However, according to a variant shown in FIGS. 2A and 2B, the opaque mask 140 may be arranged on a portion of the second surface of the support 110 that is free of the anti-reflective coating 130. Indeed, thanks to the properties of the opaque mask 140, such the anti-reflective coating 130 is not necessary for the portions of the second surface of the support 100 which are covered by an opaque mask 140.

The opaque mask 140 is arranged on the second surface of the support 110 to block the electromagnetic radiation for at least one of the masked detection structures. In order to perfect such a block, as shown partially in FIG. 1, the opaque mask 140 may be arranged to block the electromagnetic radiation for at least the masked structure and the at least one adjacent detection structure 123 on either side thereof. Such a broader block makes it possible to limit the influence of diffraction effects along the mask edges on the masked structure and to limit the potential collection of photocarriers from the area of detection structure 123 to the detection structure 122 due to the typical electrical cross-talk between adjacent pixels. Such a configuration is explained in greater detail below, in connection with FIG. 2.

As part of an application of the invention in the near infrared and mid-infrared, the first metal layer 141 may be made of gold Au, aluminum Al, or copper Cu, or even an alloy of two metals, or even an alloy of these three metals.

Note that, especially if the first metal is gold Au a bonding layer of a few nanometers may be provided between the second surface of the support 110 and the first metal layer 141. Such a bonding layer may be made of Titanium Ti or nickel Ni for the first metal, which is gold Au.

The first metal layer 141 preferably has a thickness $h_{m1}$ more than 2 times greater than a skin depth $\delta_{m1}$ of the first metal in the wavelength range, with the thickness of the first metal layer 141 preferably being greater than or equal to 4 times skin depth $\delta_{m1}$ of the first metal in the wavelength range. Note also that the thickness of the first metal layer is preferably less than $10\delta_{m1}$.

In other words, thickness $h_{m1}$ of the first metal layer preferably satisfies the inequality $2\delta_{m1} < h_{m1} < 10\delta_{m1}$ and, in a particularly advantageous way, satisfies the following inequality:

$$4\delta_{m1} \leq h_{m1} < 2\delta_{m1} \qquad (2)$$

For instance, thickness $h_{m1}$ may be substantially equal to $4\delta_{m1}$. In the event that the first metal is gold Au, gold having a refractive index of 1.24, an extinction coefficient of 15.7, and therefore a skin depth $\delta_{m1}$ of 25 nm at a wavelength of 2.5 μm, a first metal layer 141 with a thickness of 100 nm is therefore obtained.

As part of an application of the invention in the near infrared and mid-infrared, the second metal layer 142 may be made of titanium Ti or platinum Pt or tungsten W or even an alloy of titanium and tungsten.

The second metal layer 142 has a thickness $h_{m2}$ of between a 0.5 times a skin depth $\delta_{m2}$ of the second metal in the wavelength range, and 4 times the skin depth $\delta_{m2}$ of the second metal in the wavelength range. In other words, the thickness of the second metal layer 142 satisfies the following equation:

$$0.5\delta_{m2} \leq h_{m2} \leq 2\delta_{m2} \qquad (3)$$

For example, thickness $h_{m2}$ may be on the order of the skin depth of the second metal. In the event that the second metal is titanium Ti, the titanium Ti has, at a wavelength of 2.5 μm, a refractive index $n_{m2}$ of 4.36 and an extinction coefficient $k_{m2}$ of 3.19, and therefore a skin depth $\delta_{m2}$ of the titanium of 130 nm, a second metal layer 141 on the order of 130 nm, that is, between 100 nm and 160 nm, is therefore obtained.

The transparent layer 143 is made of a material, called a transparent material, with a refractive index equal to or less than 2 in the wavelength range and having an extinction coefficient $k_t$ less than or equal to 0.01 in the wavelength range. In a typical configuration of the invention, the layer of transparent material is made of a dielectric material, such as a silicon dioxide $SiO_2$, alumina $Al_2O_3$, and magnesium fluoride $MgF_2$. As a variant, the layer of the transparent material 143 may be made of a conductive oxide, such as an indium tin oxide, more commonly known by the acronym ITO, a zinc oxide, more commonly known by the acronym ZnO, and an aluminum-doped zinc oxide, more commonly known by the acronym AZO. The assembly of these materials has an extinction coefficient $k_t$ less than or equal to 0.01 in the wavelength range.

Note that the material of the transparent layer 143 preferably has a refractive index less than or equal to 1.5, which is particularly the case for silicon dioxide $SiO_2$, alumina $Al_2O_3$, and magnesium fluoride $MgF_2$.

The transparent layer 143 may have a thickness $Ep_d$ of between $\lambda_0/4n_d$ and $\lambda_0/50n_d$, inclusively, with $\lambda_0$ being a central wavelength within the wavelength range and $n_d$ being the refractive index of the transparent material 143 in the wavelength range. In other words, thickness $Ep_d$ of the transparent layer 143 may satisfy the following inequalities:

$$\frac{\lambda_0}{4n_d} \geq Ep_d \geq \frac{\lambda_0}{50n_d} \qquad (4)$$

For instance, thickness $Ep_d$ of the transparent layer 143 may be equal to $\lambda_0/10n_d$.

In the same way, the transparent layer 143 may have a thickness $Ep_d$ of between $\lambda_0/4n_d$ and $\lambda_0/25n_d$, inclusively.

The assembly of the metal elements 144 is arranged on third layer 143 and is made of the second metal. Each metal element 144 of said assembly occurs in the form of a metal bump that may assume, for example, a square or circular shape or even a hexagonal shape, according to a projection onto the second surface of the support 110.

Each metal element 144 preferably has, in a plane parallel to the second surface, at least one lateral dimension $L_{em}$ such that, for the metal elements 144 having a square projection onto the second surface of the support, a length of one side of said square, for the metal elements 144 having a circular projection onto the second surface of the support, a diameter of said circle, which is preferably less than or equal to a value Lm satisfying the following equation:

$$Lm = \frac{\lambda_0}{2n_d\sqrt{\left(1+\frac{2\delta_{m2}}{h_d}\right)}} \qquad (1)$$

where $\lambda_0$ is a central wavelength of the wavelength range, $n_d$ is a refractive index of the transparent material at said central wavelength, $h_d$ is the thickness of the transparent layer, and $\delta_{m2}$ is the skin depth of the second metal at said central wavelength.

Note that, in a particularly advantageous way, the metal elements 144 have a maximum lateral dimension and a minimal lateral dimension in the plane substantially parallel to the second surface, both of which are between 0.75 times the value Lm and 1.25 times the value Lm.

According to a first possibility of the invention, the metal elements may have a non-periodic arrangement with a spacing between two adjacent metal elements preferably having a pitch P that is less than or equal to $\lambda_0/n_d$, where $\lambda_0$ is a central wavelength of the wavelength range and $n_d$ is the refractive index of the transparent material in the wavelength range. In a particularly advantageous way, the pitch P between the two adjacent metal elements 144 in the assembly of the metal elements 144 is less than 0.75 times $\lambda_0/n_d$.

According to a second possibility of the invention, the metal elements 144 may have a periodic arrangement with a lattice pitch P that is less than or equal to $\lambda_0/n_d$, the lattice pitch preferably being less than 0.75 times $\lambda_0/n_d$. Note that according to this second possibility, the metal elements may be arranged in a square lattice with the lattice pitch P.

Note that in the case of a second non-noble metal such as Titanium Ti in order to limit the risk of oxidizing, according to a possibility not shown, a passivation layer of a few nanometers may be deposited on the metal elements 144. For instance, for a second metal consisting of titanium Ti the metal elements 144 may be covered with a passivation layer of silicon nitride SiN, or zinc sulfide ZnS at a thickness of between 5 and 30 nm. Such a passivation layer may therefore have a thickness of 10 nm, for example.

In addition, when selecting the first and second metals and the transparent material for applications of a detection component 1 cooled to a relatively low temperature, i.e. typically less than −100° C. or 173 K, these materials may be chosen to have comparable thermal expansion coefficients. According to this possibility, the first metal may be platinum Pt the second metal titanium Ti and the transparent material may be an amorphous silicon dioxide a-$SiO_2$ these materials having a thermal expansion coefficient on the order of $9.10^{-6}$ $K^{-1}$.

As a variant to the present embodiment, the metal elements may be made of a third metal. According to this variant, the third metal, as in the case of the second metal, is chosen so as to have an extinction coefficient $k_{m3}$ that is less than or equal to $2n_{m3}$, with $n_{m3}$ being the refractive index of the third metal in the wavelength range. Thus, as part of an application of the invention in the near infrared and mid-infrared, the third metal may be titanium Ti, or platinum Pt, or tungsten W, or even an alloy of titanium and tungsten.

Thus, in a practical example of this first embodiment, for a wavelength range centered around a central wavelength $\lambda_0$ of 2.7 μm, the opaque mask 140 may have the following properties:

a first metal layer 141 made of titanium Ti with a thickness $h_{m1}$ of 150 nm, a second metal layer 142 made of gold Au with a thickness $h_{m2}$ of 100 nm, a third transparent layer 143 made of silicon dioxide $SiO_2$ with a thickness ha of 120 nm, an assembly of the metal elements 144 in which the metal elements have a square-shaped projection onto the second surface of the support with a side length $L_{em}$ of 450 nm and a thickness $h_{em}$ of 200 nm, with the metal elements being arranged according to a square lattice with a pitch P of 800 nm.

The simulations of such an opaque mask 140 conducted by the inventors using the Rigorous Coupled-Waves Analysis (RCWA) show that such a mask has, as shown in FIG. 3A, a transmittance over a wavelength range going from at least 1.5 μm to 5 μm of less than $5.10^{-6}$ and a reflectivity of less than 2% over a wavelength range going from 2.45 μm to 3.1 μm with a minimum at 0.03% for the central length of 2.7 μm.

In order to demonstrate the small variation in the reflectivity R of such an opaque mask 140 with the angle of incidence of the electromagnetic radiation λ, FIG. 3A graphically illustrates the variation in the reflectivity of such an opaque mask 140 as a function of the wavelength of the electromagnetic radiation obtained for an electromagnetic radiation, identified as the curve 201, arriving at the second surface with a normal incidence, an electromagnetic radiation, identified as the curve 202, arriving on the second surface with an incidence of 30° from normal and a transverse electric polarization, that is, with an electric field parallel to the second surface of the support, and an electromagnetic radiation, identified by curve 203, arriving on the second surface with an incidence of 30° from perpendicular and a transverse magnetic polarization.

One can thus see that in the wavelength range going from 2.45 μm to 3.1 μm, the reflectivity remains below 0.02, and this regardless of the polarization and incidence of the electromagnetic radiation.

Figure 3B:
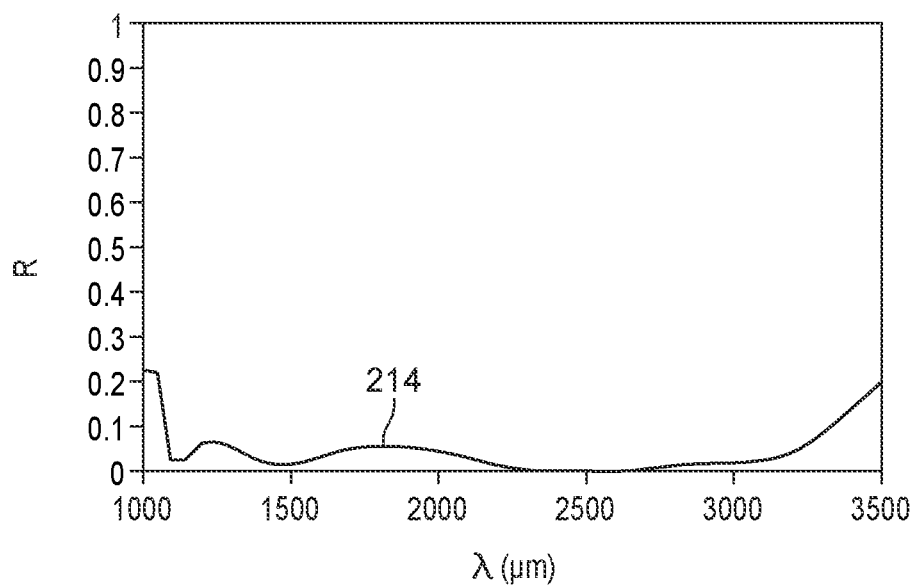

In addition, it is possible to optimize the opaque mask 140 to obtain a larger wavelength range for which the reflectivity remains below 5%. For instance, if we take the opaque mask 140 from the previous example, in which the metal elements 144 have a lateral dimension $L_{em}$ equal to 500 nm, a thickness $h_{em}$ equal to 225 nm, and a lattice pitch P of 1.1 μm, and the transparent layer 143 has a thickness $h_d$ of 140 nm, it is possible to obtain, in keeping with the inventors' simulations, a variation of the reflectivity 211 as illustrated in FIG. 3B. With such a configuration, the reflectivity over a wavelength range going from 1.1 μm to 3.3 μm remains under 6.5%.

In addition, it is possible to optimize the opaque mask 140 to obtain a larger wavelength range for which the reflectivity remains below 5%. For instance, if we take the opaque mask 140 from the previous example, in which the metal elements 144 have a lateral dimension $L_{em}$ equal to 500 run, a thickness $h_{em}$ equal to 225 nm, and a lattice pitch P of 1.1 μm, and the transparent layer 143 has a thickness $h_d$ of 140 nm, it is possible to obtain, in keeping with the inventors' simulations, a variation of the reflectivity 214 as illustrated in FIG. 3B. With such a configuration, the reflectivity over a wavelength range going from 1.1 μm to 3.3 μm remains under 6.5%.

According to the invention, and to avoid any optical leakage in the masked structure, which could originate from diffraction phenomena associated with the edges of the opaque mask 140, it is possible to arrange the opaque mask 140 on the second surface of the support 110 to block the electromagnetic radiation λ for the at least one masked structure and certain detection structures adjacent to the said at least one masked structure. Such a possibility also makes it possible to limit the leakage current phenomena which may occur in such a detection component 1 between the detection structures, and which could therefore interfere with the noise signal measured by the masked structure.

Figure 4:
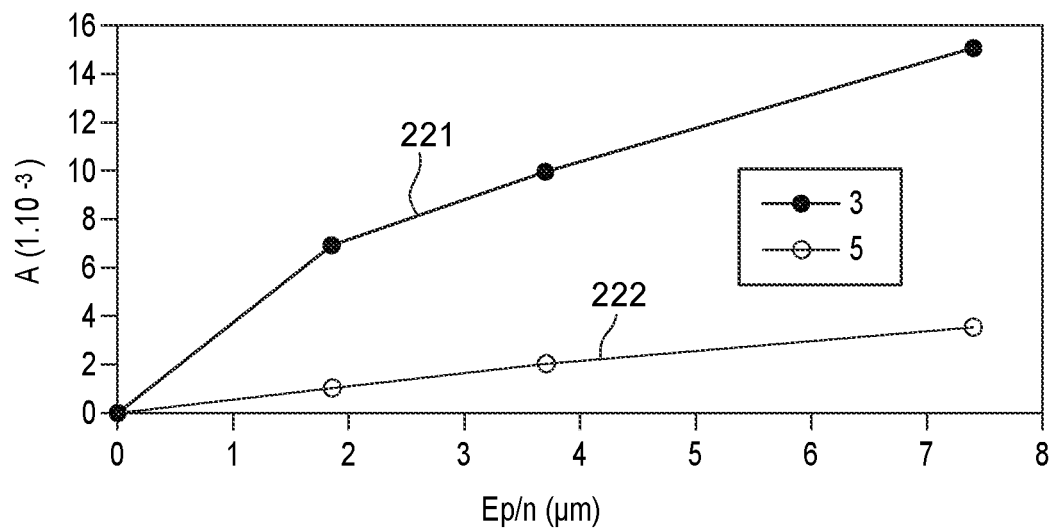
FIG. 4 is a graphic illustration of the absorption rate of a masked structure as a function of the thickness of the support, divided by the refractive index of the support, and this for two configurations of the opaque mask of the invention.

To illustrate this phenomenon, as shown in FIG. 4, the inventors calculated the absorption signal A for a masked structure, identified as the curve 221, in which the directly adjacent structures are also covered by the opaque mask 140 according to the practical example, and a masked structure, identified as the curve 222, in which the directly adjacent structures and those which are adjacent to them are also covered by the opaque mask 140 according to the practical example, and this as a function of a thickness of the support 110 divided by its refractive index. This absorption signal A includes both the absorption signal of the masked structure associated with the diffraction phenomena and the leakage currents between the detection structures 122 and 123. In this configuration simulated by the inventors, an arrangement of the structures in a matrix with a lattice pitch of 15 μm was considered.

It is therefore clear that, for a support 110 made of cadmium telluride and zinc CdZnTe, with a thickness of 10 μm, i.e. with a ratio of the support thickness to the refractive index of 7.5, the directly adjacent structures and the structures that are adjacent to them must also be covered by the opaque mask 140 to achieve an absorption of less than 0.1%.

Thus, in keeping with the calculations made by the inventors, it is possible, in the case of a detection component 1 comprising a support that is 10 thick and with an opaque mask 140 extending on either side of a projection of the masked structure on the second surface over a distance greater than 30 μm (that is, two adjacent pixels of 15 μm per side), for a distance greater than 15 μm, this absorption remains less than 0.1%. With this same support thickness, for such a distance greater than 15 μm (that is, a single adjacent pixel of 15 μm per side), this absorption remains under 0.15%.

Figure 5A:
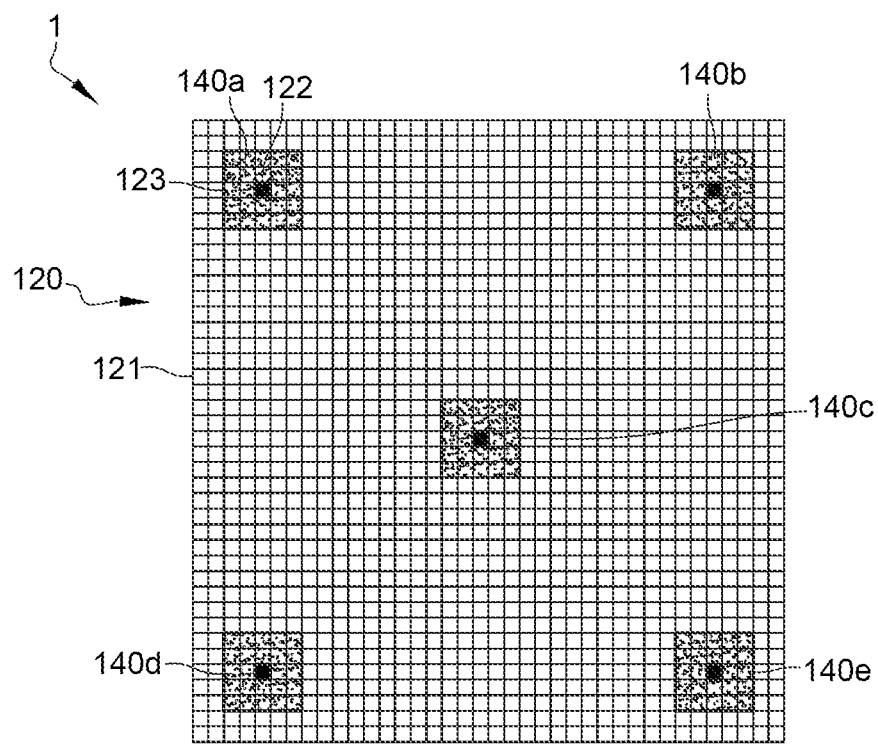
FIGS. 5A and 5B show a first and a second example of an arrangement of masking elements for a detection component in which reference masked structures are provided, respectively.
Figure 5B:
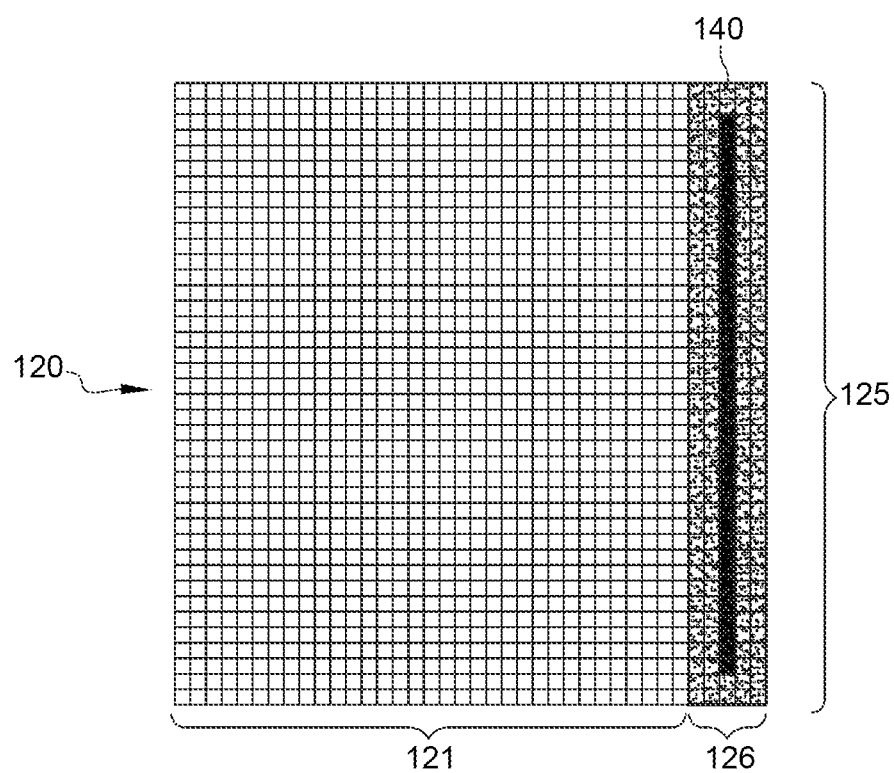

FIGS. 5A and 5B show two implementation examples of such an opaque mask 140 as part of a detection component comprising a matrix of the detection structures 121. These figures illustrate the positioning of the opaque mask or masks in relation to the projection of the matrix of detection structures onto the second surface of support 110.

According to the first example shown in FIG. 5A, it is possible to use an opaque mask 140 arranged to block the electromagnetic radiation for the individual detection structure 122. According to this possibility, the detection component comprises a plurality of opaque masks 140, each of which corresponds to a respective detection structure 122 and the corresponding adjacent detection structure 123.

According to the second preferred example shown in FIG. 5B the detection component 1 may comprise a single opaque mask 140 arranged to block the electromagnetic radiation for a plurality of masked structures arrange on an edge of the matrix of detection structures. Thus, according to this example the opaque mask is arranged next to a column of five detection structures 126 lying along said edge, with the third detection structure 125 of said column corresponding to a masked structure. Therefore, with this possibility the detection component has a line of masked structures capable of supplying a precise average noise level, since it is calculated over a large number of the masked structures.

A detection component 1 according to this first embodiment may be made using a method comprising the following steps:

a support 110 comprising a layer, called active layer 120 in which a plurality of structures 121a, 121b, 122, and 123 for detecting electromagnetic radiation λ in said wavelength range is provided, the support 110 comprising a first surface from which the active layer 120 extends, and a second surface opposite the first surface by which the support 110 is intended to receive the electromagnetic radiation λ, deposition of the first metal layer 141 made of the first metal in contact with the second surface of the support 110, deposition of the second metal layer 142 made of the second metal in contact with the first metal layer 141, deposition of the transparent layer 143 made of the transparent material in contact with the second metal layer 142, the third layer 143 being called a transparent layer, formation of an assembly of metal elements 144 made of the second metal on the transparent layer 143 opposite the second metal layer 142.

Note that the step for forming assembly of metal elements 144 may comprise a sub-step for depositing a fourth layer of the second metal with a thickness $h_{em}$, and a localized etching sub-step, for example by optical lithography, to only keep the parts of the fourth layer corresponding to the metal elements 144.

Figure 6A:
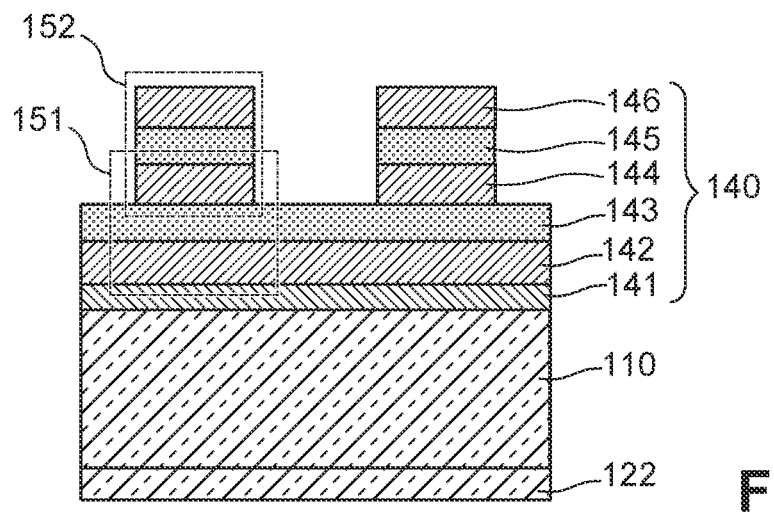
FIGS. 6A and 6B show a first and a second variant of a detection component according to the main embodiment of the invention, in which the metal structures form second MIM structures.
Figure 6B:
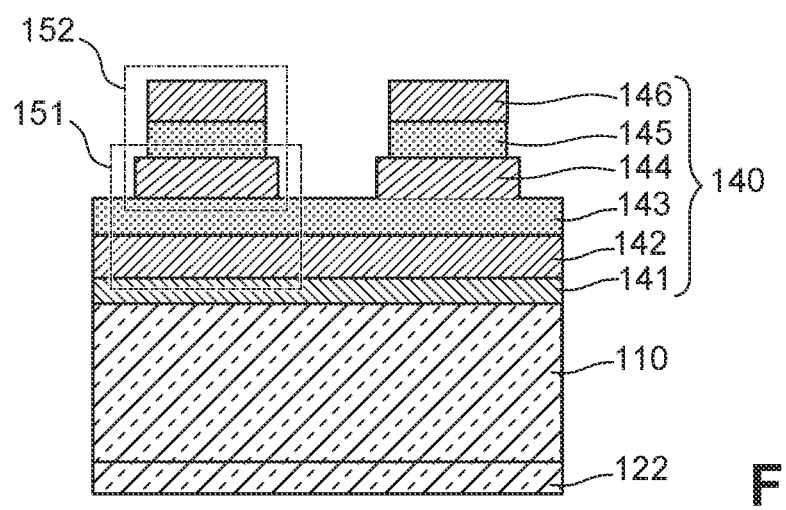

According to a first and a second variant of this main embodiment of the invention, illustrated in FIGS. 6A and 6B, respectively, the opaque mask 140 may furthermore comprise, for each metal element 144, a portion of a fourth transparent layer 145 made of the transparent material, and a portion of the fifth metal layer 146 made of the second metal, in such a way as to form a second MIM structure 152 in the wavelength range.

In such an arrangement, with metal element 144 being part of both the first MIM structure 151, in accordance with the teaching of this document and the main embodiment, as well as the second MIM structure 152, in accordance with these first and second variants, a stacking of the resonant cavities of these first and second MIM structures 151, 152 is achieved. The cavities corresponding to the second MIM structures 152 have lateral dimensions that are less than or equal to those corresponding to the first MIM structures 151, since the lateral dimensions of the cavities of the second MIM structures 152 correspond to the lateral dimensions of the portions of the fourth transparent layer 145.

As discussed below in reference to FIG. 7, such a configuration with distinct dimensions of the cavities corresponding to the first and second MIM structures 151, 152 broadens the wavelength range of opacity of the opaque mask 140, according to the first and second variants versus the main embodiment. Note that the first and second variants are particularly advantageous in the context of a wavelength range in the far infrared, for example between 8 and 14 µm, since they achieve a relatively broad opacity range without requiring a relatively low refractive index, that is, less than 2, for the transparent material, thus transparent materials are not easily found for these wavelength ranges.

Thus, taking the first variant of this first embodiment shown in FIG. 6A, a detection component 1 according to this first variant differs from a detection component according to the main embodiment in that the opaque mask 140 comprises a second successive stack for each metal element 144 starting from the third transparent layer:
said metal element 144,
a portion of the fourth transparent layer 145, called a fourth transparent layer, made of the transparent material,
a portion of the fifth metal layer 146 made of the second metal.

Note, in addition, that in this first variant the portion of the fourth transparent layer 145 and the portion of the fifth metal layer 146 extend corresponding the metal element 144 and, thus, have lateral dimensions that are identical to those of said metal element 144. The respective thickness of the fourth transparent layer 145 and of the fifth metal layer may be determined in a similar way to the thickness of the third transparent layer 143 and of the metal elements 144, respectively, and may be adjusted to optimize the wavelength range. Thus, if according to one possibility of this first variant the fourth transparent layer 145 may have a thickness identical to that of the third transparent layer 143, it is also perfectly conceivable that the fourth transparent layer 145 can have a greater thickness than that of the third transparent layer 143, with the latter preferably remaining greater than or equal to $\lambda_0/50n_d$ or even $\lambda_0/25n_d$.

Thus, according to an embodiment example of this first variant, the opaque mask 140 may have the following properties:
a first metal layer 141 of gold Au 100 nm thick,
a second metal layer 142 of titanium Ti 150 nm thick,
a third transparent layer 143 of zinc sulfide ZnS 100 nm thick,
metal elements 144 of titanium Ti 600 nm thick,
a fourth transparent layer 145 of zinc sulfide ZnS 200 nm thick,
a fifth metal layer 146 of titanium Ti 600 nm thick, and
a lateral dimension for the metal elements 144, the portions of the fourth transparent layer 145 and the fifth metal layer 146.

Figure 7:
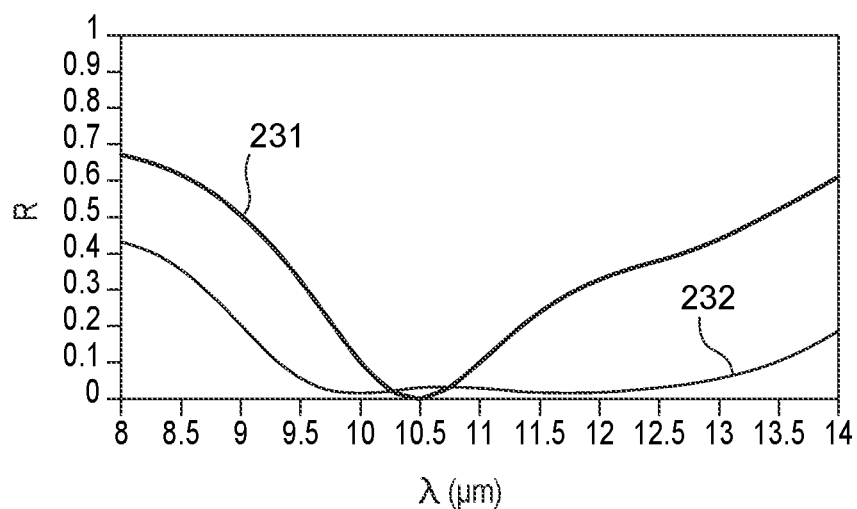
FIG. 7 is a graphic illustration of a comparison of the variation in the reflectivity of an opaque mask according to the main embodiment of the invention, to the variation in the reflectivity of an opaque mask according to the first variant of the main embodiment.

FIG. 7 compares the variation with wavelength of the reflectivity of such an opaque mask 140 versus an opaque mask according to the main embodiment having the same configuration, with the fourth transparent layer 145 and the fifth metal layer 146 being omitted.

It can be seen from this graph that such a first variant (curve 232) makes it possible to achieve a relatively extensive wavelength range, since it goes from approximately 9.50 µm to approximately 13 µm, compared to a wavelength range obtained for an opaque mask 140 according to the main embodiment (curve 231), which goes from about 10.2 µm to about 10.8 µm.

A detection component 1 according to this first variant of the main embodiment may be made by means of a manufacturing method that differs from a method for manufacturing a detection component 1 according to the first main embodiment in that, when assembly of the metal elements 144 is being made, there is a step for forming the fourth transparent layer 145 and the fifth metal layer 146 on a metal layer made of the third metal intended to form the metal elements 144, and a step for localized etching of the fifth metal layer 146, of the fourth transparent layer 145, and of the metal layer made of the third metal in order to laterally delimit the metal elements, the portions of the fourth transparent layer 145, and the portions of the fifth metal layer 146.

According to the second variant of the main embodiment of the invention, shown in FIG. 6B, the portions of the fourth transparent layer 145 and of the fifth metal layer 146 may have lateral dimensions that are less than those of the corresponding metal elements.

So, a detection component 1 according to this second variant of the first embodiment differs from a detection component 1 according to the first variant of the first embodiment in that, for each metal element 144, the portion of the corresponding fourth transparent layer 145 and the portion of the corresponding fifth metal layer 146 have lateral dimensions that are less than that of the said metal element 144.

The method for manufacturing a detection component 1 according to this second variant of the first embodiment differs from the method for manufacturing a detection component 1 according to the first variant of the first embodiment in that the step for localized etching of the fifth metal layer 146, of the fourth transparent layer 145, and of the metal layer made of the third metal is conducted in two parts, one for a local etching of the fourth transparent layer 145 and of the fifth metal layer, and the other for a local etching of the layer of the third metal. Such a local etching in two parts provides, for each metal element 144, a portion of the fourth transparent layer 145 and a portion of the fifth metal layer 146 with smaller dimensions than those of the fourth transparent layer.

Note that if, in the first embodiment of the invention and in the first and second variants of the first embodiment, the second metal layer 142 and the metal elements 144 are made of the second metal, it is still conceivable that opaque mask 140 may comprise a third metal and that the metal elements may be made of the third metal, without exceeding the scope of the invention. Such a third metal will then have an extinction coefficient $k_{m3}$ strictly less than $5n_{m3}$, or even less than or equal to $2n_{m3}$, where $n_{m3}$ is the refractive index of the third metal in the wavelength range. Likewise, if, in the first and second variants of the main embodiment, the fourth transparent layer 145 is made of the transparent material, it is also conceivable, and without exceeding the scope of the invention, that the fourth transparent layer 145 may be made of a second transparent material, with the understanding that the second material will have a refractive index less than or equal to 2 in the wavelength range. Similarly, if, in the first and second variants of the main embodiment, the fifth metal layer 146 is made of the second metal, it is also conceivable, and without exceeding the scope of the invention, that fifth metal layer 146 may be made of a fourth metal. Such a fourth metal will then preferably have an extinction coefficient $k_{m4}$ strictly less than $5n_{m4}$, or even less than or equal to $2n_{m4}$, where $n_{m4}$ is the refractive index of the fourth metal in the wavelength range.

The invention claimed is:

1. A detection component for detecting electromagnetic radiation in a wavelength range, the detection component comprising:
   a support, and an active layer in which a plurality of detectors configured to detect electromagnetic radiation in the wavelength range is arranged, the support comprising a first surface from which the active layer extends, and a second surface opposite the first surface, with the support being configured to receive the electromagnetic radiation via the second surface, and
   an opaque mask arranged on a portion of the second surface of the support to block the electromagnetic radiation for a particular detector of the detectors,
   wherein the opaque mask comprises at least a first metal, a second metal, a third metal, and a transparent material with a refractive index less than or equal to 2 in the wavelength range, the first metal having an extinction coefficient $k_{m1}$ greater than or equal to $5n_{m1}$, the second metal having an extinction coefficient $k_{m2}$ strictly less than $5n_{m2}$, and the third metal having an extinction coefficient $k_{m3}$ strictly less than $5n_{m3}$, with $n_{m1}$ $n_{m2}$, and $n_{m3}$ being refractive indices of the first metal, the second metal, and the third metal, respectively, in the wavelength range, with the transparent material having an extinction coefficient $k_t$ less than or equal to 0.01,
   wherein the opaque mask comprises, starting from the second surface of the support, a successive stack of:
   a first metal layer of the first metal,
   a second metal layer of the second metal,
   a third layer of the transparent material, and
   a group of metal components, each comprising the third metal, said group being arranged on the third layer opposite the second metal layer, and
   wherein the second metal layer, the third layer, and the group form metal-insulator-metal (MIM) structures in the wavelength range.

2. The detection component according to claim 1, wherein the second metal has an extinction coefficient $k_{m2}$ less than or equal to $2n_{m2}$ and the third metal has an extinction coefficient $k_{m3}$ less than or equal to $2n_{m3}$.

3. The detection component according to claim 1, wherein the second and third metals are identical.

4. The detection component according to claim 3, wherein each of the metal components has at least one lateral dimension L, in a plane substantially parallel to the second surface, less than or equal to a value Lm satisfying:

$$Lm = \frac{\lambda_0}{2n_d\sqrt{\left(1 + \frac{2\delta_{m2}}{h_d}\right)}}$$

where $\lambda_0$ is a central wavelength within the wavelength range, $n_d$ is a refractive index of the transparent material at the central wavelength, $h_d$ is a thickness of the transparent layer, and $\delta_{m2}$ is a skin depth of the second metal at the central wavelength.

5. The detection component according to claim 4, wherein each of the metal components has a maximum lateral dimension and a minimal lateral dimension within a plane substantially parallel to the second surface, of between 0.75 times the value Lm and 1.25 times the value Lm.

6. The detection component according to claim 3, wherein each component in the group has a thickness in a stacking direction of the opaque mask that is between one times a skin depth $\delta_{m3}$ of the third metal in the wavelength range and three times the skin depth $\delta_{m2}$ of the second metal.

7. The detection component according to claim 1, wherein the first metal layer has a thickness $h_{m1}$ greater than 2 times a skin depth $\delta_{m1}$ of the first metal in the wavelength range.

8. The detection component according to claim 1, wherein the second metal layer has a thickness $h_{m2}$ of between 0.5 times a skin depth $\delta_{m2}$ of the second metal in the wavelength range, and 4 times the skin depth $\delta_{m3}$ of the second metal in the wavelength range.

9. The detection component according to claim 1, wherein in the group, two adjacent metal components have an inter-barycentric distance therebetween that is less than or equal to $\lambda_0/n_d$, where $\lambda_0$ is a central wavelength of the wavelength range and $n_d$ is the refractive index of the transparent material in the wavelength range.

10. The detection component according to claim 9, wherein components in the group are arranged periodically with a pitch P between components of less than $\lambda_0/n_d$.

11. The detection component according to claim 1, wherein the third layer has a thickness of between $\lambda_0/4n_d$ and $\lambda_0/50n_d$, inclusively, with $\lambda_0$ being a central wavelength in the wavelength range and $n_d$ being the refractive index of the transparent material in the wavelength range.

12. The detection component according to claim 1, wherein the opaque mask is arranged on the second surface of the support to block the electromagnetic radiation for the particular detector and those detectors adjacent to the particular detector.

13. The detection component according to claim 12, wherein the opaque mask is further arranged to block the electromagnetic radiation for any detector adjacent to those detectors adjacent to the particular detector.

14. The detection component according to claim 13, the support has a thickness of less than 10 µm, with the opaque mask extending, on either side of a projection of the particular detector, on the second surface of the support over a distance greater than 15 µm.

15. The detection component according to claim 1, wherein the opaque mask further comprises a fourth metal and a second transparent material, said second transparent material having a refractive index less than or equal to 2 in the wavelength range, and
   wherein, for each metal component in the group of metal components, there is a second successive stack, starting from the third layer, of:
   the metal component, a portion of a fourth layer made of the second transparent material, and a portion of a fifth metal layer made of the fourth metal, wherein, for each metal component in the group of metal components, the portion of the fourth layer and the portion of the fifth metal layer form a second MIM structure in the wavelength range.

16. A method for manufacturing a detection component for detecting electromagnetic radiation in a wavelength range, the manufacturing method comprising:

providing a support and an active layer in which a plurality of detectors configured to detect electromagnetic radiation in said wavelength range is arranged, the support comprising a first surface from which the active layer extends, and a second surface opposite the first surface, the support being configured to receive the electromagnetic radiation via the second surface, starting from the second surface of the support, forming a successive stack of:
a first metal layer of a first metal,
a second metal layer of a second metal,
a third layer of a transparent material with a refractive index less than or equal to 2 in the wavelength range, and
a group of metal components, each comprising a third metal, said group being arranged on the third layer opposite the second metal layer, with the second metal layer, the third layer, and the group forming metal-insulator-metal (MIM) structures in the wavelength range, wherein an opaque mask is arranged on a portion of the second surface of the support to block the electromagnetic radiation for a particular detector of the detector, wherein the opaque mask comprises the first metal, the second metal, and the third metal, and the transparent material, with the first metal having an extinction coefficient $k_{m1}$ greater than or equal to $5n_{m1}$, and the second metal having an extinction coefficient $k_{m2}$ strictly less than $5n_{m2}$, and the third metal an extinction coefficient $k_{m3}$ strictly less than $5n_{m3}$, with $n_{m1}$, $n_{m2}$, and $n_{m3}$ being refractive indices of the first metal, the second metal, and the third metal, respectively, in the wavelength range, with the transparent material having an extinction coefficient $k_t$ less than or equal to 0.01.

17. The method for manufacturing an electromagnetic radiation detection component according to claim 16, wherein the forming step further comprises:

depositing the first metal layer made of the first metal in contact with the second surface of the support, depositing the second metal layer made of the second metal in contact with the first metal layer, depositing the third layer made of the transparent material in contact with the second metal layer, and forming the group of metal components, each including the third metal, on the third layer opposite the second metal layer.

18. The method for manufacturing an electromagnetic radiation detection component according to claim 16, wherein, during the opaque mask forming step, the opaque mask is arranged on the second surface of the support to block the electromagnetic radiation for the particular detector and those detectors adjacent to the particular detector.

19. The method for manufacturing an electromagnetic radiation detection component according to claim 16, further comprising:

for each metal component in the group of metal components, forming a portion of a fourth layer, of a second transparent material, and a portion of a fifth metal layer of a fourth metal so as to form a second stack for each metal component, comprising in succession, starting from the third layer: the metal component, the portion of the fourth layer, and the portion of the fifth metal layer, wherein the second transparent material has a refractive index less than or equal to 2 in the wavelength range, and wherein, for each metal component in the group of metal components, the portion of the fourth layer and the portion of the fifth metal layer form a second MIM structure in the wavelength range.

* * * * *